(12) United States Patent
Bouras et al.

(10) Patent No.: US 6,541,304 B1
(45) Date of Patent: Apr. 1, 2003

(54) METHOD OF DISPENSING A VISCOUS MATERIAL

(75) Inventors: Carlos E. Bouras, Encinitas; Duong T. La, San Diego; Andre S. Gamelin, Visa; Alan R. Lewis, Carlsbad; Mark S. Meier, Encinitas; Alec J. Babiarz, Leucadia, all of CA (US)

(73) Assignee: Nordson Corporation, Westlake, OH (US)

(*) Notice: Subject to any disclaimer, the term of this patent is extended or adjusted under 35 U.S.C. 154(b) by 0 days.

(21) Appl. No.: 09/273,479

(22) Filed: Mar. 22, 1999

Related U.S. Application Data

(62) Division of application No. 08/963,993, filed on Nov. 4, 1997, now Pat. No. 5,906,682, which is a continuation of application No. 08/543,052, filed on Oct. 13, 1995, now abandoned.

(51) Int. Cl.$^7$ .............................................. H01L 21/48

(52) U.S. Cl. ....................... 438/108; 438/118; 438/126; 438/127; 222/52; 222/146.1; 118/666; 118/712

(58) Field of Search .................................. 438/108, 124, 438/126, 127, 106, 109, 118, 119; 257/778, 787; 118/323, 324, 664, 666, 667, 712; 222/1, 54, 55, 56, 57, 52, 63, 135, 146.1, 146.2, 146.5

(56) References Cited

U.S. PATENT DOCUMENTS

| | | | |
|---|---|---|---|
| 3,994,256 A | 11/1976 | Moen | 118/3 |
| 4,271,092 A | 6/1981 | Sullivan et al. | 261/30 |
| 4,406,247 A | 9/1983 | Baughman et al. | 118/684 |

(List continued on next page.)

FOREIGN PATENT DOCUMENTS

| | | |
|---|---|---|
| EP | 0403280 | 12/1990 |
| JP | 61146541 | 7/1986 |
| JP | 1184078 | 7/1989 |

(List continued on next page.)

OTHER PUBLICATIONS

James E. DeVries, Dispensing and Application Equipment for Adhesives and Sealants, ASM International, pp. 693–702, 1991.

(List continued on next page.)

*Primary Examiner*—Albert W. Paladini
*Assistant Examiner*—Alonzo Chambliss
(74) *Attorney, Agent, or Firm*—Wood, Herron & Evans, L.L.P.

(57) ABSTRACT

A system for dispensing a viscous material onto a substrate which includes a dispensing element, a viscous material reservoir and a metering device coupled between the reservoir and the dispensing element for metering a variable amount of a viscous material through the dispensing element. The dispensing element and metering device can be moved by a positioner along a predetermined pattern adjacent a surface of a substrate. A weigh scale located adjacent the substrate receives a metered amount of the viscous material and produces signals representative of a variable weight of the material dispensed during a predetermined time interval. A controller adjusts a speed of movement of the positioner along the predetermined pattern to cause the dispensing element to dispense a desired amount of material based on a calculated flow rate. Alternatively, the controller adjusts a rate of delivery of the metering device based on the calculated flow rate to cause the dispensing element to dispense the desired amount of material along the predetermined pattern. Closed loop temperature control may be provided for the dispensing element and/or the substrate to ensure a substantially constant viscosity and a substantially constant flow rate. A prime and purge station may be provided adjacent the substrate for sucking air bubbles from the dispensing element and metering device.

17 Claims, 2 Drawing Sheets

U.S. PATENT DOCUMENTS

| | | | |
|---|---|---|---|
| 4,431,690 A | 2/1984 | Matt et al. | 427/424 |
| 4,470,369 A | 9/1984 | Edgerton | 118/723 |
| 4,620,893 A | 11/1986 | Parrens | 156/345 |
| 4,666,732 A | 5/1987 | Schucker | 427/8 |
| 4,667,852 A | 5/1987 | Siemann | 222/54 |
| 4,682,710 A | 7/1987 | Turner, Jr. et al. | 222/63 |
| 4,682,711 A | 7/1987 | Reighard et al. | 222/75 |
| 4,787,332 A | 11/1988 | Geisel et al. | 118/410 |
| 4,891,249 A | 1/1990 | McIntyre | 427/421 |
| 4,935,261 A | 6/1990 | Srivastava et al. | 427/10 |
| 4,987,854 A | 1/1991 | Hall | 118/679 |
| 5,052,338 A | 10/1991 | Maiorca et al. | 118/668 |
| 5,175,018 A | 12/1992 | Lee et al. | 427/8 |
| 5,208,064 A | 5/1993 | Becker et al. | 427/8 |
| 5,263,608 A | 11/1993 | Kiernan et al. | 222/1 |
| 5,271,521 A | 12/1993 | Noss et al. | 222/1 |
| 5,322,706 A | 6/1994 | Merkel et al. | 427/8 |
| 5,348,604 A | 9/1994 | Neff | 156/272.8 |
| 5,377,961 A * | 1/1995 | Smith et al. | 266/237 |
| RE35,010 E | 8/1995 | Price | 222/1 |
| 5,437,727 A | 8/1995 | Yoneda et al. | 118/669 |
| 5,510,149 A | 4/1996 | Schucker | 427/421 |
| 5,554,224 A | 9/1996 | Foltyn | 118/725 |
| 5,558,504 A | 9/1996 | Stridsberg | 417/322 |
| 5,711,989 A * | 1/1998 | Ciardella et al. | 427/96 |
| 5,906,682 A * | 5/1999 | Bouras et al. | 118/712 |
| 5,935,375 A * | 8/1999 | Nakazawa et al. | 156/356 |
| 6,173,864 B1 * | 1/2001 | Reighard et al. | 222/55 |
| 6,213,347 B1 * | 4/2001 | Thomas | 222/52 |

FOREIGN PATENT DOCUMENTS

| | | |
|---|---|---|
| JP | 02303571 | 12/1990 |
| JP | 2303571 | 12/1990 |
| JP | 3296461 | 12/1991 |
| JP | 4244257 | 9/1992 |
| JP | 57815 | 1/1993 |
| JP | 5211202 | 8/1993 |
| JP | 669286 | 3/1994 |
| JP | 3170301 | 6/1994 |
| JP | 6169157 | 6/1994 |
| JP | 775870 | 3/1995 |
| JP | 63141240 | 6/1998 |

OTHER PUBLICATIONS

Asymtek, A–600 Dispensepro™, Brochure, 8/91 (6 pages).

Asymtek, Three Fully Automated Fluid Dispensing Product Lines, Press Release, Feb. 1992 (3 pages).

Asymtek, AV–2000 Automatic Fiducial Locator, Brochure, undated (1 page).

Asymtek, A–618C Automated Fluid Dispensing System, Brochure, undated (4 pages).

Herb Turner, Automation and Robotics for Adhesives and Sealants Use, ASM International, pp. 716–725, 1991.

Herb Turner, Robotic Dispensing of Cold Sealants and Adhesives New Developments, Nordson Corporation, 1988.

Brochure, Nordson Corporation, *Pro–Flo System*, 1995.

Brochure, Nordson Corporation, *Flo Melt System*, 1984.

Robotics World, Flexible Automation—Intelligent Machines, May/Jun. 1989.

Request for Quotation dated Nov. 16, 1992 (8 pages).

Ayymtek, Process Notes for Successful Encapsulation and Underfilling in MCM Assembly, Nov. 1994 (4 pages).

Asymtek, The EN–600 Encapsulant System, Brochure, Mar. 1993 (2 pages).

* cited by examiner

METHOD OF DISPENSING A VISCOUS MATERIAL

CROSS-REFERENCE TO RELATED APPLICATIONS

This is a divisional application of Ser. No. 08/963,993 filed Nov. 4, 1997, now U.S. Pat. No. 5,906,682, which is a continuation application of Ser. No. 08/543,052 filed Oct. 13, 1995, now abandoned.

BACKGROUND OF THE INVENTION

The present invention relates to automated equipment used in dispensing viscous materials. More particularly, the present invention relates to a system and method which in their preferred embodiments may be used for automatically dispensing the underfill epoxy used to attach silicon chips directly to printed circuit ("PC") boards comprising FR4 or similar laminate substrates.

In the manufacture of PC boards it is frequently necessary to apply small amounts of viscous materials, i.e. those with a viscosity greater than fifty centipoise. Such materials include, by way of example and not by limitation, general purpose adhesives, solder paste, solder flux, solder mask, grease, oil, encapsulants, potting compounds, epoxies, die attach pastes, silicones, RTV and cyanoacrylates. Heretofore the common methods of application have included screening, pin transfer and dispensing from a syringe or valve. Screening requires a template and is not readily adaptable to changing application patterns. Pin transfer is relatively fast but the tooling is expensive and inflexible and can only form dots, not lines. Syringe dispensing is widely used and is accomplished with pneumatic mechanisms, electromechanical mechanisms or positive displacement valves.

In the quest for ever increasing miniaturization of circuitry a fabrication process known as flip chip technology has developed. This technology is also known as direct chip attach or "DCA". It includes "flip chip" bonding, dies attached directly to substrates, wire bonding, coated dies and encapsulated dies. One such process which is widely used is called controlled columnar collapsed connection ("C4") which is covered by U.S. Patents owned by International Business Machines Corporation.

Referring to the drawings, a semiconductor die-or flip chip 10 (FIG. 1) is provided with a pattern of solder bumps or balls 12 on an underside or circuit side thereof The solder balls 12 are registered with plated solder pads 14 on a PC board or other substrate 16. The underside of the chip 10 is also referred to as the image side of the chip. Flux (not illustrated) is normally supplied between the solder balls 12 and solder pads 14. Upon heating, the solder pads 14 on the PC board or substrate 16 reflow and physically connect with the solder balls 12 on the underside of the chip 10. The solder balls 12 typically have a high melting point and therefore do not reflow. This connection is illustrated diagrammatically in FIG. 2 by deformed solder pad 14' mating with a solder ball 12. The requirement for wire bonding is thereby eliminated.

Since the flip chip 10 is not necessarily encapsulated in a plastic or ceramic package, the connections between the PC board 16 and the chip 10 can corrode. In order to prevent this corrosion, a special liquid epoxy 18 (FIG. 3) is allowed to flow and completely cover the underside of the chip. This is referred to herein as the "underfill operation." Upon curing, the resulting encapsulation forms a non-hygroscopic barrier to prevent moisture from contacting and thus corroding the electrical interconnects between the PC board 16 and the chip 10. The epoxy 18 also serves to protect the bonds between the deformed solder pads 14' and the solder balls 12 by providing thermal stress relief, i.e. accommodating differential rates of thermal expansion and contraction. Stated another way, once cured the epoxy 18 has a co-efficient of thermal expansion ("CTE") which together with its bonding properties minimizes the thermal stress induced by the difference between the CTE of the silicon chip 10 and the CTE of the FR4 PC board 16.

Advantages of using flip chip on board architecture include: 1) the potential for increased input and output ("I/O") as the entire die area beneath the chip is available for connection; 2) an increase in electronic processing speed due to shorter transmission line lengths; 3) the ability to fit a heat sink to the top of the chip, 4) a substantial reduction in chip profile and 5) more efficient use of PC board real estate.

Referring to FIG. 3 of the drawings, once the underfill operation is complete, it is desirable that enough liquid epoxy be deposited to encapsulate all of the electrical interconnections and so that a fillet 18a is formed along the side edges of the chip 10. A properly formed fillet 18a ensures that enough epoxy has been deposited to provide maximum mechanical strength of the bond between the chip 10 and the PC board or substrate 16. If too much epoxy is deposited, a mound 18b (FIG. 4) will be produced which undesirably encircles the side edges of the chip 10 and extends along the upper surface of the chip.

The aforementioned underfill operation requires that a precise amount of the liquid epoxy 18 be deposited in a more or less continuous manner along at least one side edge of the semiconductor chip 10. The liquid epoxy flows under the chip 10 as a result of capillary action due to the small gap between the underside of the chip 10 and the upper surface of the PC board or substrate 16. If too little epoxy is deposited, some of the electrical interconnections will not be encapsulated. Corrosion may result and thermal stresses may not be relieved. If too much epoxy is deposited, it may flow beyond the underside of the chip and interfere with other semiconductor devices and interconnections. Excess epoxy may also encroach on the upper side of the chip 10 as shown at 18b in FIG. 4 and interfere with proper heat dissipation of a heatsink.

During the underfill operation, it is necessary to precisely control the temperature of the liquid epoxy or other liquid adhesive. The liquids that are utilized are often stored in a frozen state. They are thereafter thawed and utilized in connection with a dispensing syringe. However the viscosity of this type of adhesive changes rapidly with time as it cures, sometimes doubling within four hours of being thawed. This complicates the task of dispensing the correct amount of fluid, because if its viscosity increases too much, capillary action will not be sufficient to make it completely flow under the chip. Therefore, there is a need to determine when the liquid adhesive has reached the predetermined viscosity that renders it no-useable in an underfill operation.

In the past PC boards have been heated by conduction through direct mechanical contact, with lamps or with convective heat, i.e. gas flow. Often such heating is performed in belt ovens having successive air zones, the temperature of which can be independently controlled to achieve a given heating profile. It has also been conventional in the dispensing of minute amounts of adhesives and other viscous materials to employ a heater for maintaining the temperature of the dispensing needle and/or valve, and the viscous material therein, at a predetermined level. However, the prior art methods of controlling temperature in the conventional assembly of PC boards have not provided very accurate control of the viscosity.

Accordingly, it would be desirable to provide an automated viscous material dispensing system and method in which the amount of material dispensed could be precisely controlled, taking into account variations in the viscosity of the material itself.

SUMMARY OF THE INVENTION

The present invention provides a system for dispensing a viscous material onto a substrate which includes a dispensing element, a viscous material reservoir and a metering device coupled between the reservoir and the dispensing element for metering a variable amount of a viscous material through the dispensing element. The dispensing element and metering device can be moved by a positioner along a predetermined pattern adjacent a surface of a substrate. A weigh scale located adjacent the substrate receives a metered amount of the viscous material and produces signals representative of a variable weight of the material dispensed during a predetermined time interval. Thus a flow rate of material can be accurately determined. A controller adjusts a speed of movement of the positioner along the predetermined pattern to cause the dispensing element to dispense a desired amount of material based on a calculated flow rate. Alternatively, the controller adjusts a rate of delivery of the metering device based on the calculated flow rate to cause the dispensing element to dispense the desired amount of material along the predetermined pattern. Closed loop temperature control may be provided for the dispensing element and/or the substrate to ensure a substantially constant viscosity and a substantially constant flow rate. A prime and purge station may be provided adjacent the substrate for sucking air bubbles from the dispensing element and metering device.

DETAILED DESCRIPTION OF THE PREFERRED EMBODIMENTS

The entire disclosure of pending U.S. patent application Ser. No. 08/192,709 filed Feb. 7, 1994 and entitled COMPUTER CONTROLLED VISCOUS FLUID DISPENSING SYSTEM is specifically incorporated herein by reference.

Figure 5:
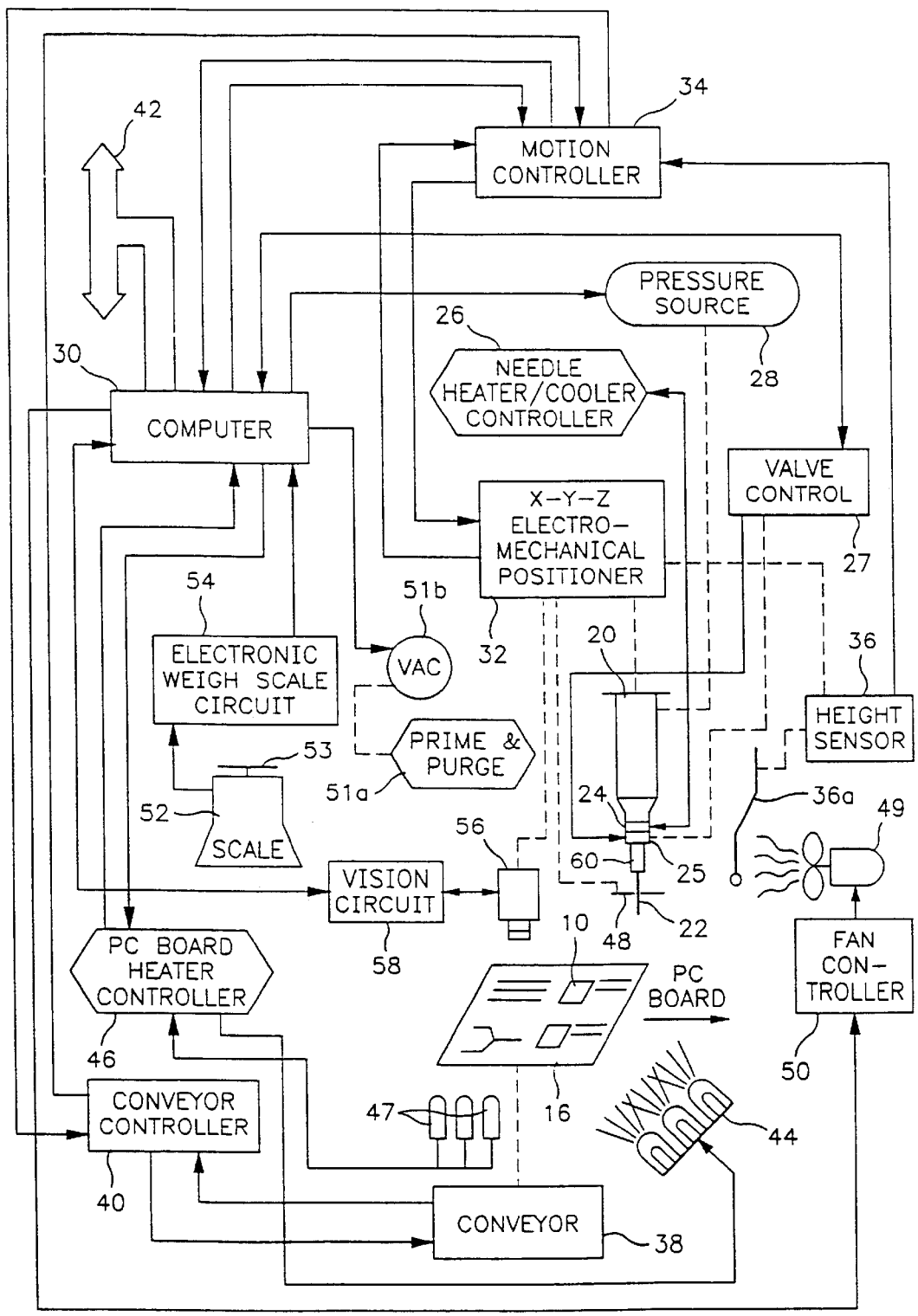
FIG. 5 is a block diagram of the preferred embodiment of our viscous material dispensing system. The phantom connecting lines represent mechanical connections and the solid connecting lines represent electrical connections.

Referring to FIG. 5, our system includes a fluid reservoir in the form of a conventional disposable plastic syringe 20 connected to a dispensing element in the form of a needle 22. The needle 22 is surrounded by a heat sink 24 which includes separate resistive heating and temperature sensing elements (not illustrated). The heat sink 24 may also incorporate a cooling element (not illustrated) such as a Peltier diode. Alternatively, the heat sink may also incorporate a miniature vortex cooling generator which may be coupled to a source of pressurized air hereafter described. One suitable vortex generator is Part No 3202 commercially available from Exair Corp.

The syringe 20 (FIG. 5) is coupled to the dispensing needle 22 through a metering device in the form of a conventional auger valve 25. This valve acts as a positive displacement pump and includes a motor driven screw for metering a variable amount of the viscous material inside the syringe through the needle 22. The motor in the auger valve 25 is controlled through a valve control circuit 27 which in turn is connected to a system computer 30 which indirectly controls the auger valve 25. The heating, cooling and temperature sensing elements in the heat sink 24 are connected to a needle heater/cooler controller circuit 26.

The syringe 20 is pressurized through its upper end by a source of pressurized air 28 actuated by the system computer 30 for propelling viscous material to the valve 25. The system computer 30 controls the dispensing of viscous material, such as epoxy adhesive, in accordance with a stored operation program. This enables the dispensing of minute amounts of adhesive or other viscous material from the body of the syringe 20 through the needle 22 onto the upper surface of the PC board or substrate 16.

The syringe 20, valve 25 and needle 22 are mounted for movement along X, Y and Z axes by electro-mechanical components collectively referred to as a positioner 32 in FIG. 5. These components are driven by a motion controller circuit 34 which also communicates with the system computer 30. Mechanisms for rapidly moving the syringe 20 along the X and Y axes are disclosed in U.S. Pat. No. 4,967.933 entitled METHOD AND APPARATUS FOR DISPENSING VISCOUS MATERIALS, the entire disclosure of which is incorporated herein by reference. A mechanism for moving the syringe along the Z axis, albeit as a much slower rate, is also disclosed in the aforementioned U.S. Pat. No. 4,967,933.

A height sensor 36 (FIG. 5) is mounted to the X-Y-Z positioner 32 so that the needle 22 can be placed a predetermined dispensing height above (or distance away from) the working surface of the PC board or substrate 16. The height sensor 36 includes a vertically reciprocable height sensing arm 36a. The upper end of the arm 36a breaks a light beam when the syringe is moved downwardly toward the PC board 16 by the positioner 32. This indicates to the motion controller circuit 34 that the predetermined dispensing height has been achieved. The arm 36a may be retracted by a solenoid mechanism (not illustrated) which forms a part of the height sensor 36. The height sensor 36 also includes a manually adjustable lead screw mechanism (not illustrated) for adjusting the dispensing height, as needed. Height sensors of the foregoing type are well known and need not be further described herein.

The PC board or other mounting substrate 16 is transported horizontally beneath the needle 22 by an automatic conveyer 38 as indicated by the horizontal arrow in FIG. 5.

The conveyer 38 is of conventional design and has a width which can be adjusted upon demand to accept different sizes of PC boards. The conveyer 38 also includes pneumatically operated lift and lock mechanisms (not illustrated). A conveyer controller 40 is connected to the conveyer 38. The conveyer controller 40 interfaces between the motion controller 34 and the conveyer 38 for controlling the width adjustment and the lift and lock mechanisms of the conveyer 38. The conveyer controller 40 also controls the entry of the PC board 16 into the system and the departure therefrom upon completion of the dispensing of adhesive or other viscous material onto the upper surface of the same.

Computer automated design ("CAD") data from a disk or a computer integrated manufacturing (CIM) controller (not illustrated) can be utilized by the system computer 30 to control the motion of the positioner 32 and the dispensing needle 22 through the motion controller 34. This ensures that the adhesive or other viscous material being deposited onto the upper surface of the PC board 16 will be accurately placed in the precise amount required. In applications where CAD data is not available, the software utilized by the system computer 30 can allow for the dispensing locations and quantities to be directly programmed. Our system also preferably employs a camera and vision circuit hereafter described to precisely locate the needle 22 relative to the edge of the chip 10.

The system computer 30 utilizes X and Y locations, component types, and component orientations to determine where and how much adhesive or other viscous material to dispense onto the upper surface of the PC board or substrate 16. The system computer 30 is preferably provided with standard RS 232 and SMEMA communications buses 42 which are compatible with most types of other automated equipment utilized in fully automated PC board assembly lines.

A radiant heat source such as a plurality of infrared bulbs 44, is energized by a PC board heater controller circuit 46. The actual amount of localized heating of the PC board or substrate 16 in different discrete zones is sensed by a plurality of heat sensors 47 such as IR sensitive thermocouples positioned to accurately detect the temperature of the PC board or substrate 16. A heat shield 48 deflects heat from the bulbs 44 away from the needle 22, heat sink 24 and auger valve 25. The heat shield 48 may comprise a horizontally disposed black anodized Aluminum sheet carried by the positioner 32. The heat shield 48 has a hole through which the needle 22 protrudes. A fan or blower 49 conveys air across the PC board 16 under control of the system computer 30 via fan controller 50 to provide ambient cooling on demand.

The dispensing needle 22 may be moved to a prime and purge station 51a (FIG. 5) which is connected to a vacuum source 51b controlled by the system computer 30. The prime and purge station 51a includes a resilient valve-like boot (not illustrated) which is pierced by the needle 22 so that it communicates with an interior chamber (not illustrated) upon which a vacuum is pulled by the vacuum source 51b. This also serves to clean the outside of the needle tip. The resilient boot is similar to the resilient valve found on a basketball. A close fitting seal without valve function will also suffice. The prime and purge operation is done prior to the dispensing operation to ensure that all bubbles in the valve 25 and needle 22 are eliminated. Bubbles are particularly undesirable in this type of a system since they can drastically affect the dispensing accuracy in terms of volume.

The preferred embodiment of our system also includes a precision electronic weigh scale 52 having a platen 53. The output signals from the weigh scale 52 are fed to an electronic weigh scale circuit 54. This circuit 54 is connected to the system computer 30. By way of example, the weigh scale 52, platen 53 and electronic weigh scale circuit 54 may he collectively provided in the form of a Model No. DI-100 analytical weigh scale commercially available from Denver Instruments. This type of weigh scale utilizes digital circuitry for highly accurate measurements of minute weights, and includes an RS232 interface. It may be desirable, and in some cases necessary, to provide the weigh scale 52 with resilient vibration mounting (not illustrated) to ensure accurate weight measurements. The needle 22 can be moved to the weigh scale 52 by the positioner 32 and a minute amount of adhesive may be deposited onto the platen 53. The system computer 30, through the electronic weigh scale circuit 54, determines the precise amount of the metered viscous material by weight delivered per unit of time. The calculated flow rate is then utilized in the dispensing operation as hereafter described.

A charge coupled device ("CCD") video camera 56 (FIG. 5) is mechanically connected to the X-Y-Z positioner 32 for travel along with the dispensing needle 22. Its lens is pointed downwardly so that the upper or other working surface of the PC board or other substrate 16 is in its field of view. The camera 56 is electrically connected to a conventional vision circuit 58 for interfacing with the system computer 30. An edge detection algorithm is executed by the system computer 30 to help locate an edge of the chip 10 on the PC board 16 to facilitate positioning of the tip of the needle 22 adjacent at least one side edge thereof. Preferably in one continuous operation the needle 22 is moved in an L-shaped pattern to dispense liquid epoxy along two adjacent side edges. A second L-shaped pass of the needle 22 along the remaining two side edges is performed. It is called a perimeter fill and ensures that a proper fillet 18a extends around the entire periphery of the die 10. This complete fillet 18a aids in the mechanical strength of the chip-to-board bond.

Figure 1:
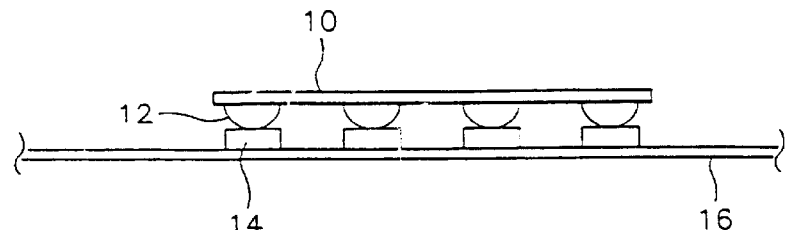
FIG. 1 is a fragmentary diagrammatic side elevation view of a semiconductor flip chip having its solder balls registered with the solder pads of a PC board in accordance with the prior art.
Figure 2:
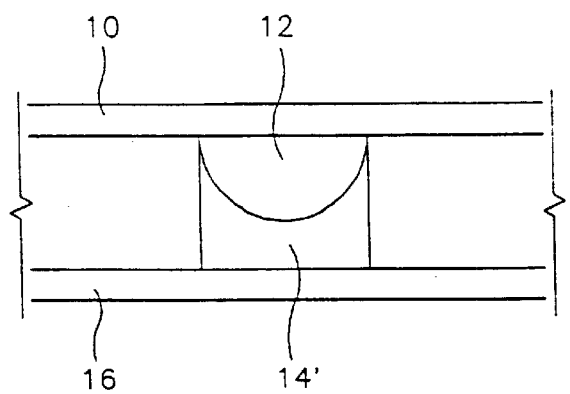
FIG. 2 is greatly enlarged, fragmentary diagrammatic elevation view showing the interconnection of one of the deformed solder pads of FIG. 1 with its corresponding solder ball after reflow in accordance with the prior art.

The preferred embodiment of our system illustrated in block diagram form in FIG. 5 comprises a plurality of mechanical, electronic and electromechanical components which are preferably mounted on an upright, open rectangular steel frame as generally illustrated in FIG. 1 of the aforementioned pending U.S. patent application Ser. No. 08/192,709. The frame can be inserted into any modern fully automated PC board assembly line. The system computer 30 may be any commercially available extended industry standard architecture ("EISA") personal computer with sufficient memory and processing capability to rapidly carry out the required interface and command functions described herein.

The preferred embodiment of our viscous fluid dispensing system may be utilized to perform the preferred embodiment of our method as follows. Once the closed loop temperature of the heat sink 25 has stabilized the system computer 30 causes the positioner 32 to move the needle 22 to the prime and purge station 51a. The needle 22 is plunged into the resilient valve or close fitting seal of the station 51a. The vacuum source 51b is energized to suck any air bubbles out of the viscous material inside the auger valve 25 and the needle 22. The system computer 30 then causes the positioner 32 to withdraw the needle 22 from the prime and purge station 51a and move it to the weigh scale 52. A small amount of viscous material is deposited onto the platen 53 of the weigh scale 52. This small amount is variable depending on the viscosity, even though the auger valve 25 may be energized for a predetermined time interval at a predetermined speed. The duration of the deposit, as indicated by the amount of time the motor of the auger valve 25 is energized, and the measured weight, are utilized to calculate a volumetric flow rate.

Figure 3:
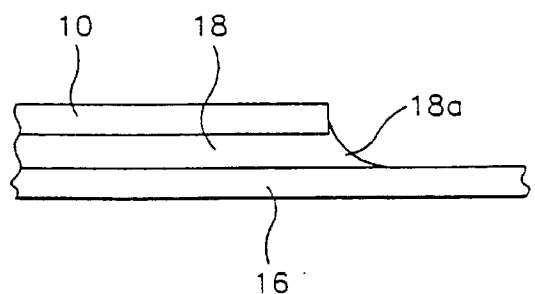
FIG. 3 is a somewhat enlarged, fragmentary side elevation view of the chip and PC board of FIG. 1 illustrating the proper formation of a fillet of adhesive material adjacent the side edge of a chip which has been underfilled with liquid adhesive in accordance with the prior art.
Figure 4:
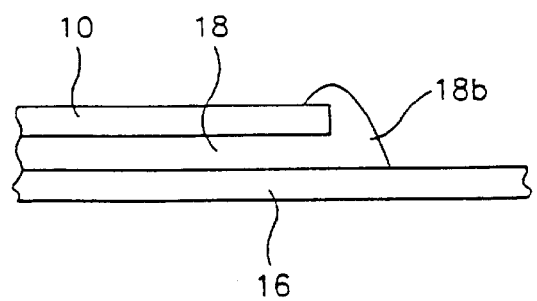
FIG. 4 is a somewhat enlarged, fragmentary side elevation view of the chip and PC board of FIG. 1 illustrating a mound of liquid adhesive which can undesirably form over the top edge of the chip when an excessive amount of the adhesive is deposited during the conventional underfill process.

The system computer 30 then causes the PC board 16 to be pulled along a predetermine path by the conveyer 38 above the infrared lamps 44. The lower surface of the PC board 16 is heated to a predetermined elevated temperature. This temperature is precisely controlled by the system computer 30 through the PC board heater controller 46 which monitors the surface temperature at different zones through the heat sensors 47. The upper surface of the PC board is correspondingly heated in discrete zones by conduction through the board. Using pre-programmed component location data and/or the vision sub-system and pre-programmed pattern and dispensing amount data, the system computer 30 moves the dispensing needle 22 to one side edge of the chip 10 which is to receive the underfill operation. The needle 22 is lowered to place its lower end at the predetermined dispensing height. e.g. seven mils, above the upper surface of the PC board 16 utilizing the height sensor 36 and the X-Y-Z positioner 32. The system computer 30 then causes the needle 22 to move along two adjacent side edges of the chip 10. Simultaneously the auger dispensing valve 25 is momentarily energized to dispense viscous material, in the form of an epoxy adhesive, onto the PC board 16 so that is wicks under the chip 10. The speed of the movement of the syringe 20 and the needle 22 along the X and Y axes is precisely controlled to deposit or lay down a predetermined desired quantity of adhesive based upon the calculated flow rate. This desired quantity of adhesive is sufficient to ensure that each of the solder ball-to-solder pad connections of the flip chip 10 is encapsulated with liquid epoxy. The amount of adhesive is enough to form the fillet 18a (FIG. 3), but not the undesirable mound 18b (FIG. 4).

Preferably our system periodically moves the needle 22 to the prime and purge station 51a to expel viscous material in the needle after a predetermined idle time. This material may have cured too much. Preferably our system also periodically moves the needle 22 to the weigh scale 52 for re-calculation of the flow rate and adjusts of the speed of movement of the needle as needed to ensure the delivery of a desired amount of material. Mass flow is determined on a closed loop basis.

It will thus be understood that in our system, the flow rate of the auger valve 25 is first determined while the heat sink 24 is maintained at a predetermined substantially constant temperature by the closed loop syringe heater/cooler controller circuit 26. This holds the viscosity of the material substantially constant. The system computer 30 assumes that there will be a predetermined flow rate during energization of the auger valve 25. The drive speed of the auger valve 25, and thus the flow rate therefrom, are maintained substantially constant and are not continuously adjusted. Instead, the system computer 30 adjusts the X-Y translating speed of the needle 22 to dispense the appropriate amount of liquid epoxy that will achieve optimum underfill. Alternatively, the speed of the auger valve 25 may be continuously adjusted while maintaining a predetermined fixed speed of translation of the needle 22 over the PC board.

Our system takes an initial measurement at the weigh scale 52 to determine the dispensing flow rate. It need not adjust the valve 25, but instead adjusts the speed of movement of the dispensing needle 22 in the X-Y plane to ensure that the desired amount of adhesive is dispensed. Optimum heating of the particular surface region of the PC board 16 with the bulbs 44 ensures that the epoxy adhesive will wick or flow completely underneath the chip 10. The bulbs 44 rapidly heat the lower surface of the PC board once it is brought into position by the conveyor 38.

The PC board 16 preferably needs to be heated up to a set point of approximately eighty degrees C. in less than thirty seconds and maintained at that temperature. The temperature of any portion of the PC board 16 which will come into contact with the liquid epoxy adhesive must be closely maintained, i.e. within plus or minus five degrees C. of the foregoing set point. Infrared ("IR") vacuum heater bulbs 44 are preferably utilized to heat the PC board 16 to enable all our system to achieve this objective. Such bulbs can come up to full temperature in approximately 1.4 seconds, allowing them to be used in a closed loop fashion where it is desired to rapidly achieve the set point, e.g. in thirty seconds or less. The non-contact heat sensors 47 are important components of the closed loop temperature control of the PC board 16. The design of the PC board heater controller circuit 46 will be readily understood by those skilled in the art, and its details need not be described herein.

Preferably, our system is able to closely control the weight of the fluid dispensed, e.g. to within plus or minus ten percent of a target for a given chip. The analytical weigh scale 52 is used to periodically measure the flow rate from the auger valve 25. The speed of the dispensing needle 22 in the X-Y plane is precisely controlled so that the desired weight (amount) of epoxy adhesive is deposited.

The valve 25 uses a motor to rotate an auger screw which in turn pushes viscous fluid or material through the dispensing needle 22. An indication of the viscosity of the fluid may be obtained by measuring the torque of the motor of the auger screw valve. Since the fluid is in contact with the walls of the valve and the auger screw the viscosity (of the fluid affects the resisting torque. The torque can be monitored to indicate that the viscosity of the material has risen too high, e.g. due to partial curing, to underfill the chip. Circuits which may be incorporated into the valve control circuit 27 for monitoring the motor torque by sensing the back electromotive force ("EMF") of the motor coils are well known and need not be described in detail herein.

The auger valve 25 is preferably a hardened-steel, auger screw, rotary positive displacement pump that incorporates the disposable needle 22 and an automatic cleaning system which eliminates the need for valve removal and disassembly. One suitable valve is the ASYMTEK (Trademark) Model No. DV-06 commercially available from Asymptotic Technologies, Inc. of Carlsbad, Calif., the assignee of the subject application. Prior to dispensing, the system moves the valve 25 and needle 22 so that the height sensor 36 can automatically locate the height of the needle tip. The system then moves the needle 22 to the prime and purge station 51a.

The valve 25 includes a direct drive motor. The back EMF on the valve 25 is continually monitored by the valve control circuit 27. This enables the valve to be dynamically adjusted. As the fluid changes in viscosity it tends to slow the motor. By measuring the back EMF the valve control circuit 27 increases the power to the motor to maintain a consistent motor speed within one percent and thereby achieves a substantially constant fluid flow rate.

Our system preferably places the PC board 16 at three locations. 1) a preheat zone; 2) a dispense heat zone; and 3) a post heat zone. The conveyor 38 includes automatic width adjustment capabilities to accommodate a variety of PC board sizes. Underboard support rails (not illustrated) for thin substrates may be incorporated into the conveyor. The width, speed and dwell time of the conveyor 38 are fully programmable.

The repeatable success of the underfill process depends on exact thermal management of the PC board or substrate 16, the fluid and the general system environment. Substrate heating at all zones is preferably effected through the use of ultra-fast IR heating bulbs 44 capable of ramping to full temperature within two seconds. Each heat zone preferably consists of three heat sectors, utilizing two bulbs per sector. The zones are preferably monitored by three corresponding IR thermocouples. Each thermocouple is capable of sensing the average temperature of an area beneath the PC board that is approximately one inch in diameter. Closed loop substrate temperature control is accomplished with heat sensors 47 monitored through software.

The temperature control of our system can achieve programmable ramp rates in excess of four degree C. per second. Since the PC board or other substrate 16 is heated from below, the temperature ramp rates at the top of the PC board and the gradient from top to bottom depend on the substrate's thickness and thermal conductivity. Thus, for thin PC boards such as an 0.018 inch thickness FR-4 board, the top of the PC board will be at optimum heat in about twenty seconds, while a thicker material such as 0.040 inch thickness FR-4 PC board will take longer, i.e. about forty seconds. The measured temperature uniformity over the PC L boards dispensed area is preferably plus or minus five degrees C.

Thermal management of the epoxy adhesive involves controlling its temperature at two locations: 1) within the valve, and 2) at the dispense point. The viscous fluid within the valve 25 must be maintained at close to ambient temperature, normally twenty-seven degrees C. This is partially achieved by use of the metal heat shield 48 which surrounds the valve 25, a phenolic heat shield 60 surrounding all but the lower end of the needle 22 and laminar flow cooling around the valve via fan 49. This laminar flow also serves to cool the general system environment. The viscous fluid at the dispense point (needle 22) is heated or cooled by the heat sink with closed loop feedback as previously described.

Precise, consistent control of the dispensed fluid mass is essential for the underfill process to be performed in optimum fashion. Too much fluid will overtop the ship 10 and not enough will result in an incomplete underfill. The dispensing and underfill tasks are further complicated because liquid epoxy has a relatively short pot life. Its viscosity may increase as much as one-hundred percent within four hours due to partial curing. To insure precise dispensing, our system incorporates two features, namely, a mass flow calibration feature (weigh scale 52 and weigh scale circuit 54) and a precision positive displacement pump (auger valve 25).

The mass flow calibration weigh scale 52 is preferably located next to the prime and purge station 51a. It weighs a variable amount of the viscous fluid dispensed over a predetermined time interval and is accurate to plus or minus one-half milligram. After the sample is weighed, the dispensing parameters are then adjusted to dispense the desired amount of fluid over the time required to execute the dispense pattern. The flow rate changes as the viscosity changes. Therefore the flow rate is automatically measured at user specified intervals and the X-Y speed of the needle 22 and/or speed of the valve 25 are adjusted to compensate for this change in viscosity.

In the underfill operation, the needle 22 dispenses viscous material along a predetermined pattern, e.g. an L-shaped fillet along two sides of the chip 10. Capillary action draws the viscous fluid under the chip. After an appropriate dwell time to allow the adhesive to completely underfill the chip, the opposite sides of the chip are preferably perimeter filled with a smaller amount of fluid.

The system computer 30 can execute automatic fiducial alignment. The underfill process requires additional vision capabilities to accurately locate the chip 10 for placement and process control as well as accurate dispensing. This task is complicated by the wide variations in backside chip color and reflectivity as well as the similarity in appearance of the components to the solder mask on certain PC boards. To differentiate the chip 10 from the PC board 16, special lighting (not illustrated ) may be incorporated into our system for visual contrast.

While we have described a preferred embodiment of our dispensing system and method, it should be apparent that modifications and adaptations thereof will occur to those skilled in the art. For example, our dispensing system may be utilized in connection with other work pieces besides PC boards and substrates utilized in the electronics industry. Therefore, the protection afforded our invention should only be limited in accordance with the scope of the following claims.

We claim:

1. A method of underfilling a space between a semiconductor flip chip and a substrate to completely encapsulate a plurality of solder bumps and solder pads with a viscous material, comprising:

providing a pressurized reservoir for holding the viscous material;

coupling a positive displacement pump outside the pressurized reservoir for metering a variable amount of the viscous material from the pressurized reservoir coupled to the pump and through a dispensing element connected to the pump;

maintaining the dispensing element at a first substantially constant temperature;

maintaining the substrate at a second substantially constant temperature;

metering a first variable amount of viscous material dispensed through the dispensing element onto a weigh scale during a time interval and measuring a weight thereof;

calculating a flow rate based upon the time interval and the measured weight; and moving the dispensing element along at least one side edge of the flip chip mounted on the substrate and metering a second desired amount of viscous material through the dispensing element based on the calculated flow rate, the second amount of viscous material being sufficient to completely encapsulate the plurality of solder bumps and solder pads without overflowing an upper side of the flip chip.

2. A method according to claim 1 wherein the second desired amount of material is dispensed by controlling a speed of movement of the dispensing element relative to the chip while maintaining a substantially constant delivery rate of the positive displacement pump.

3. A method according to claim 1 wherein the second desired amount of material is dispensed by adjusting a speed of the positive displacement pump while maintaining a substantially constant speed of movement of the dispensing element relative to the chip.

4. A method according to claim 1 wherein the first variable amount of material is periodically dispensed and weighed to recalculate the flow rate and the speed of movement of the dispensing element is adjusted to account for variations in the viscosity of the material to thereby insure that the second desired amount of material is repeatedly dispenser.

5. A method according to claim 1 wherein the first variable amount of material is periodically dispensed and weighed to recalculate the flow rate and the speed of the positive displacement pump is adjusted to insure that the second desired amount of material is repeatedly dispensed.

6. A method of dispensing a viscous material on an electronic component with a dispensing system including a dispensing element, the method comprising:

pressurizing a reservoir for holding the viscous material;

metering a variable amount of the viscous material from the pressurized reservoir using a positive displacement pump coupled with the dispensing element and positioned outside the pressurized reservoir;

dispensing a test amount of the viscous material from the dispensing element onto a calibrating device using the positive displacement pump;

measuring the test amount with the calibrating device;

producing at least one signal representative of the measured test amount;

calculating a flow rate of the viscous material based on the at least one signal;

adjusting the speed of movement of a positioner for moving the dispensing element relative to the electronic component based on the calculated flow rate to cause the dispensing element to dispense a desired amount of the viscous material; and dispensing the viscous material on the electronic component with the dispensing element using the positive displacement pump.

7. A method according to claim 6, wherein measuring the test amount further comprises weighing the test amount.

8. A method of dispensing a viscous material on an electronic component with a dispensing system including a dispensing element, the method comprising:

pressurizing a reservoir for holding the viscous material;

metering a variable amount of the viscous material from the pressurized reservoir using a positive displacement pump coupled with the dispensing element and positioned outside the pressurized reservoir, the pump having a variable pumping speed for controlling a rate of delivery of the viscous material from the dispensing element;

dispensing a test amount of the viscous material from the dispensing element onto a calibrating device using the positive displacement pump;

measuring the test amount with the calibrating device;

producing at least one signal representative of the measured test amount;

calculating a flow rate of the viscous material based on the produced signal;

adjusting the rate of delivery of the viscous material by varying the pumping speed of the positive displacement pump based on the calculated flow rate to cause the dispensing element to dispense a desired amount of the viscous material; and dispensing the desired amount of the viscous material on the electronic component with the positive displacement pump and the dispensing element.

9. A method according to claim 8, wherein measuring the test amount further comprises weighing the test amount.

10. A method of dispensing a viscous material onto a substrate during the assembly of an electronic component and the substrate, the viscous material being heated to a first target temperature and the substrate being heated to a second target temperature, the method comprising:

pressurizing a reservoir for holding the viscous material;

metering a variable amount of the viscous material from the pressurized reservoir through a dispensing element connected to a positive displacement pump which is located outside the pressurized reservoir;

measuring a first temperature representative of the temperature of the viscous material within the dispensing element using a temperature sensing element;

comparing the measured first temperature to the first target temperature using a first closed loop control;

measuring a second temperature representative of the temperature of the substrate using a heat sensor;

comparing the measured second temperature to the second target temperature using a second closed loop control;

changing the first and second measured temperatures to respectively correspond to the first and the second target temperature; and dispensing the viscous material onto the substrate using the positive displacement pump.

11. A method of dispensing a viscous material onto a substrate from a dispensing element carried by an X-Y-Z positioner, the method comprising:

pressurizing a reservoir for holding the viscous material;

metering a variable amount of the viscous material from the pressurized reservoir using a positive displacement pump coupled with the dispensing element and positioned outside the pressurized reservoir;

dispensing a first amount of the viscous material from the dispensing element onto the substrate along a path using the positive displacement pump;

dispensing a second amount of the viscous material from the dispensing element onto a weigh scale using the positive displacement pump;

measuring the weight of the second amount of the viscous material with the weigh scale; and using the measured weight in a closed loop control to adjust the rate of delivery of the viscous material along the path so that the first amount of the viscous material is equal to a desired amount of the viscous material.

12. A method according to claim 11 wherein using the measured weight in a closed loop control to adjust the rate of delivery further comprises:

adjusting the speed of movement of the dispensing element relative to the substrate along the path.

13. A method according to claim 12 further comprising:

maintaining a constant temperature of the viscous material dispensed from the dispensing element; and maintaining a constant temperature of the substrate.

14. A method according to claim 11 wherein using the measured weight in a closed loop control to adjust the rate of delivery further comprises:

adjusting the flow rate of the viscous material dispensed from an orifice of the dispensing element.

15. A method according to claim 11 wherein using the measured weight in a closed loop to adjust the rate of delivery further comprises:

adjusting a speed of movement of the X-Y-Z positioner.

16. The method of claim 11 wherein the second amount of material is dispensed for a predetermined time.

17. A method of dispensing a viscous material on an electronic component with a dispensing system including a dispensing element, a calibrating device, and a positioner, the method comprising:

pressurizing a reservoir for holding the viscous material;

metering a variable amount of the viscous material from the pressurized reservoir using a positive displacement pump coupled with the dispensing element and positioned outside the pressurized reservoir;

dispensing a test amount of the viscous material from the dispensing element onto the calibrating device using the positive displacement pump;

measuring the test amount with the calibrating device;

producing at least one signal representative of the measured test amount;

adjusting the speed of movement of the positioner for moving the dispensing element relative to the electronic component based on the produced signal to cause the dispensing element to dispense a desired amount of the viscous material; and dispensing the viscous material on the electronic component with the positive displacement pump and the dispensing element.

* * * * *

UNITED STATES PATENT AND TRADEMARK OFFICE
CERTIFICATE OF CORRECTION

PATENT NO. : 6,541,304 B1
DATED : April 1, 2003
INVENTOR(S) : Carlos E. Bouras et al.

It is certified that error appears in the above-identified patent and that said Letters Patent is hereby corrected as shown below:

Title page,
Item [75], Inventors, delete "Andre S. Gamelin, Visa;".

Column 1,
Line 45, delete "-".
Lien 47, change "thereof" to -- thereof. --.

Column 2,
Line 58, change "no-useable" to -- non-useable --.

Column 4,
Line 43, change "4,967,933" to -- 4,967,933 --.

Column 6,
Line 5, change "he" to -- be --.

Column 8,
Line 61, change "locations." to -- locations: --.
Line 65, after "conveyor" insert -- 38 --.

Column 9,
Line 25, delete "L".
Line 42, change "ship" to -- chip --.

Column 11,
Line 4, change "dispenser" to -- dispensed --.

UNITED STATES PATENT AND TRADEMARK OFFICE
CERTIFICATE OF CORRECTION

PATENT NO. : 6,541,304 B1
DATED : April 1, 2003
INVENTOR(S) : Carlos E. Bouras et al.

It is certified that error appears in the above-identified patent and that said Letters Patent is hereby corrected as shown below:

<u>Column 12,</u>
Line 63, add -- control -- after "loop".

Signed and Sealed this

Second Day of March, 2004

JON W. DUDAS
*Acting Director of the United States Patent and Trademark Office*